United States Patent
Beer

(10) Patent No.: US 6,922,365 B2
(45) Date of Patent: Jul. 26, 2005

(54) READ-OUT CIRCUIT FOR A DYNAMIC MEMORY CIRCUIT, MEMORY CELL ARRAY, AND METHOD FOR AMPLIFYING AND READING DATA STORED IN A MEMORY CELL ARRAY

(75) Inventor: Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 132 days.

(21) Appl. No.: 10/653,652

(22) Filed: Sep. 2, 2003

(65) Prior Publication Data

US 2004/0090833 A1 May 13, 2004

(30) Foreign Application Priority Data

Sep. 2, 2002 (DE) .......................................... 102 40 345

(51) Int. Cl.[7] ................................................. G11C 7/00
(52) U.S. Cl. ............................. 365/189.05; 365/230.08
(58) Field of Search ...................... 365/189.05, 230.06, 365/230.08, 149

(56) References Cited

U.S. PATENT DOCUMENTS

| | | | | |
|---|---|---|---|---|
| 5,161,120 | A | * 11/1992 | Kajimoto et al. | ...... 365/189.05 |
| 6,028,796 | A | *  2/2000 | Miyabayashi | ...... 365/189.05 |
| 6,275,407 | B1 | *  8/2001 | Otsuka | ............... 365/63 |
| 6,665,204 | B2 | * 12/2003 | Takeda | ............... 365/63 |
| 2001/0011735 | A1 |  8/2001 | Takeda | |

* cited by examiner

Primary Examiner—Gene N. Auduong
(74) Attorney, Agent, or Firm—Laurence A. Greenberg; Werner H. Stemer; Ralph E. Locher

(57) ABSTRACT

A read-out circuit for a dynamic memory circuit has an interchanging circuit. The interchanging circuit can apply the bit lines that are connected to the storage capacitors to the second and third data output lines and to apply the bit lines that are not connected to the memory cells to the first and fourth data output lines. Sense amplifiers, in each case, are provided for amplifying a potential difference on a first line and a second line. A first sense amplifier is connected to the first and the second data output line. A second sense amplifier is connected to the third and the fourth data output line. A third sense amplifier is connected to the second and the third data output line.

9 Claims, 5 Drawing Sheets

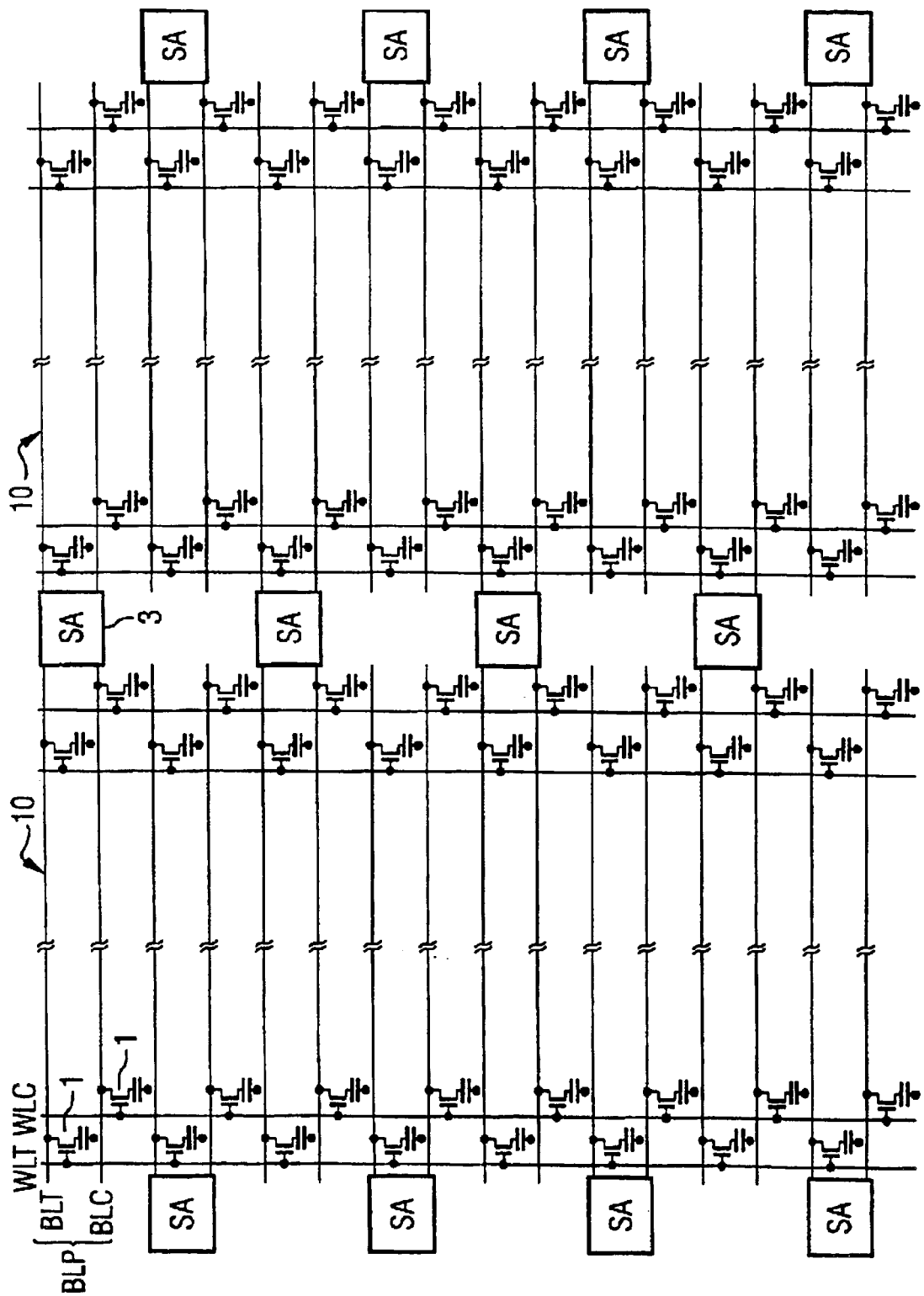

READ-OUT CIRCUIT FOR A DYNAMIC MEMORY CIRCUIT, MEMORY CELL ARRAY, AND METHOD FOR AMPLIFYING AND READING DATA STORED IN A MEMORY CELL ARRAY

BACKGROUND OF THE INVENTION

Field of the Invention

The invention relates to a read-out circuit for a dynamic memory circuit, a memory cell array, and a method for amplifying and reading data stored in a memory cell array.

Dynamic memory circuits, such as DRAMs, have memory cells with storage capacitors whose charge can be applied to a bit line in a switchable manner by using a word line. In order to be able to detect the small charge of a storage capacitor, use is made of sense amplifier circuits that can detect a small charge difference between a bit line and its adjacent bit line. In this case, they amplify the small potential difference of the two adjacent bit lines, and the bit line with the lower potential is pulled to a low potential and the bit line with the higher potential (high potential) is pulled to a high potential.

When data are read out from the memory cells, errors can occur if a memory cell with a strong signal (i.e. large charge stored in the storage capacitor) lies beside a memory cell with a weak signal (small stored charge). Since the sense amplifiers amplify the strong signal more rapidly, it can happen that the potential swing occurring on the bit line at the cell with the strong signal causes an adjacent bit line likewise to experience a potential swing as a result of coupling. If the bit line belongs to a bit line pair at a memory cell with a weak signal, then the coupling of the strong signal onto the adjacent bit line can have the effect that the potential difference to be amplified is reversed and the memory cell with the weak signal is developed in the wrong direction. During read-out, this can have the effect that an erroneous datum is read out from the memory cell with the weak signal.

SUMMARY OF THE INVENTION

It is accordingly an object of the invention to provide a read-out circuit for a dynamic memory circuit, a memory cell array, and a method for amplifying and reading data stored in a memory cell array that overcome the hereinafore-mentioned disadvantages of the heretofore-known devices of this general type and that reduce the probability of obtaining an error due to signal crosstalk during the read-out of the memory cells.

With the foregoing and other objects in view, there is provided, in accordance with the invention, a read-out circuit including an interchanging circuit, and a first, a second, and a third sense amplifier. The interchanging circuit is connected to each of the bit lines of one of the bit line pairs and has a first data output line, a second data output line adjacent the first data output line, a third data output line adjacent the second output line, and a fourth data output line adjacent the third output line. The interchanging circuit is configured to apply the bit lines connected to the storage capacitors to the second and third data output lines by activating the word line and to apply the bit lines not connected to the memory cells to the first and fourth data output lines. The first sense amplifier is connected to the first and the second data output lines. The second sense amplifier is connected to the third and the fourth data output lines. The third sense amplifier is connected to the second and the third data output lines. The first, second, and third sense amplifiers each are configured to amplify a potential difference on the respective two connected lines.

With the objects of the invention in view, there is also provided a memory cell array. The memory cell array includes word lines, bit lines organized in pairs, memory cells addressable via the word lines and the bit lines, and a read-out circuit. Each of the memory cells have a respective storage capacitor. Each of the storage capacitors are connectable to one of the bit lines of one of the bit line pairs by activation by one of the word lines. The read-out circuit is as described in the previous paragraph.

With the objects of the invention in view, there is also provided a method for amplifying and reading data stored in a memory cell array. The method begins with a read-out circuit as described above. The next step is activating one of the word lines. The next step is driving the interchanging circuit to apply the bit lines connected to the storage capacitors to the second and third data output lines.

In other words, the invention provides a read-out circuit for a dynamic memory circuit. In this case, the memory cells of the memory cell array are addressable via word lines and bit lines, the bit lines being organized into bit line pairs. The storage capacitors of the memory cells can in each case be connected to a bit line of a bit line pair by activation of a word line. Furthermore, an interchanging circuit is provided, which is connected to the bit lines of two bit line pairs, and which has a first data output line, a second data output line adjacent the first, a third data output line adjacent the second, and a fourth data output line adjacent the third. The interchanging circuit is connected in such a way as to apply the bit lines that are connected to the storage capacitors to the second and third data output lines and to apply the bit lines that are not connected to the memory cells to the first and fourth data output lines. Furthermore, provision is made of sense amplifiers for amplifying a potential difference between two lines. A first sense amplifier is connected to the first and the second data output line, a second sense amplifier is connected to the second and the third data output line, and a third sense amplifier is connected to the third and the fourth output line.

The read-out circuit according to the invention has a sense amplifier for each bit line pair in order to amplify charge differences on the adjacent bit lines of a bit line pair with respect to one another. Between adjacent bit lines, including those of different bit line pairs, a signal coupling arises particularly in the event of potential changes that occur when the potential difference on the bit lines is amplified by the sense amplifier.

The bit lines to which the charge of the storage capacitor of a memory cell is applied and bit lines to which no storage capacitor has been applied normally lie alternately beside one another. If the same items of information (either a high charge or a low charge) are stored in two adjacent memory cells, then the bit lines are alternately pulled to a high and a low potential. If the storage capacitor is less than the customary storage capacitor of the rest of the memory cells due to fluctuations in the production process or if a cell has lost charge owing to leakage mechanisms, then the charge difference on the adjacent bit lines of the corresponding bit line pair is lower and the sense amplifier has a longer response time. If a "strong" memory cell with a high charge storage capacitor is connected to a bit line pair that is adjacent thereto, then the sense amplifier at this bit line pair reacts more rapidly and isolates the potentials of the adjacent bit lines of this bit line pair more rapidly. The voltage swing can lead to signal crosstalk which alters the charge of one of the lines of the bit line pair with the lower storage capacitor in such a way that the charge difference on the bit line pair is reversed and the sense amplifier isolates the potentials in the wrong direction. This leads to an incorrect item of information being read out from the memory cell.

In order to avoid this, the invention provides a further sense amplifier situated between two adjacent bit lines of different bit line pairs. An interchanging circuit is additionally provided in order to connect to the further sense amplifier in each case the bit line to which the storage capacitor is applied by activation of the word line. In this way, those bit lines onto which the charges of the respective storage capacitor have flowed are present at the further sense amplifier.

If the two memory cells are occupied by different charges i.e. different items of information, in the event of activation of the word lines, then both the sense amplifiers at the bit line pairs and the further sense amplifier between two adjacent bit lines of different bit line pairs isolate the potentials, so that the further sense amplifier supports the isolation of the potentials on a bit line pair.

If identical items of information are stored in the two memory cells, then the two bit lines connected to the further sense amplifier in each case experience a charge swing by the charge of a memory cell, in which case a potential difference may occur on the two bit lines e.g. as a result of a different magnitude of the storage capacitors. The potential difference between strong signal and weak signal is always less than the potential difference between the bit line with the strong signal and the bit line without an applied storage capacitor, so that the further sense amplifier performs the charge isolation significantly more slowly than the sense amplifier for the start signal. In the meantime, the potential on the respectively adjacent bit lines of the two bit line pairs is amplified by the sense amplifiers attached thereto, and the potentials of the adjacent bit lines of different bit line pairs are increased or decreased and the charge isolation of the further sense amplifier is thus suppressed.

It may furthermore be provided that a first and a second word line is provided. The first bit line of the respective bit line pair is able to be connected to the corresponding storage capacitors by activation of the first word line. The second bit line of the respective bit line pair can be connected to the corresponding storage capacitors by activation of the second word line. The interchanging circuit is configured in such a way as to apply, in the event of activation of the first word line, the first bit lines of the two bit line pairs to the second and the third data output line and the second bit lines to the first and the fourth data output line, and to apply, in the event of activation of the second word line, the second bit lines of the two bit line pairs to the second and the third data output line and the first bit lines to the first and the fourth data output line. In this case, the interchanging circuit can be activated by separate control signals or else by the word line activation signal for activating the respective word line. What is important is that the memory cells, which are activated by the word line, are applied to the second and third data output lines, i.e. the middle two data output lines. This is necessary in order that the further sense amplifier can support the read-out of information in the case of different information contents of adjacent memory cells.

It is preferably provided that the driver strength of the second sense amplifier is less than the driver strength of the first and/or third sense amplifier. In this way, it is possible to avoid the situation in which, in the event of two memory cells having the same content, which are activated by the word line, and storage capacitors of different magnitude, the potential difference brought about as a result on the adjacent bit lines of different bit line pairs leads to isolation of this charge before the sense amplifiers connected to the bit line pairs perform the charge isolation. In this case, the bit line to which the weaker memory cell, i.e. the memory cell with the lower capacitor, is connected is pulled to a low potential. If the driver strength of the second sense amplifier is lower, then this charge isolation is prevented, however, by the faster potential difference amplification of the first and the third sense amplifiers, since the latter have a higher driver strength.

It may furthermore be provided that a potential equalization circuit is provided between the first data output line and the fourth data output line in order to equalize the potentials between the first data output line and the fourth data output line depending on an equalization control signal. In the event of the memory cells read having identical contents, this equalization device serves to support the first and third sense amplifiers to the effect of increasing the potential of the second and third bit lines counter to the second sense amplifier's effort to spread these potentials apart. What is thus achieved is that the first and third sense amplifiers are supported relative to the second sense amplifier, so that the undesirable effect of the second sense amplifier, namely the potential isolation, can be better prevented.

Other features that are considered as characteristic for the invention are set forth in the appended claims.

Although the invention is illustrated and described herein as embodied in a read-out circuit for a dynamic memory circuit, a memory cell array, and a method for amplifying and reading data stored in a memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic illustration of a configuration of read-out circuits according to the prior art in a cell array;

DESCRIPTION OF THE PREFERRED EMBODIMENTS

Figure 1A:
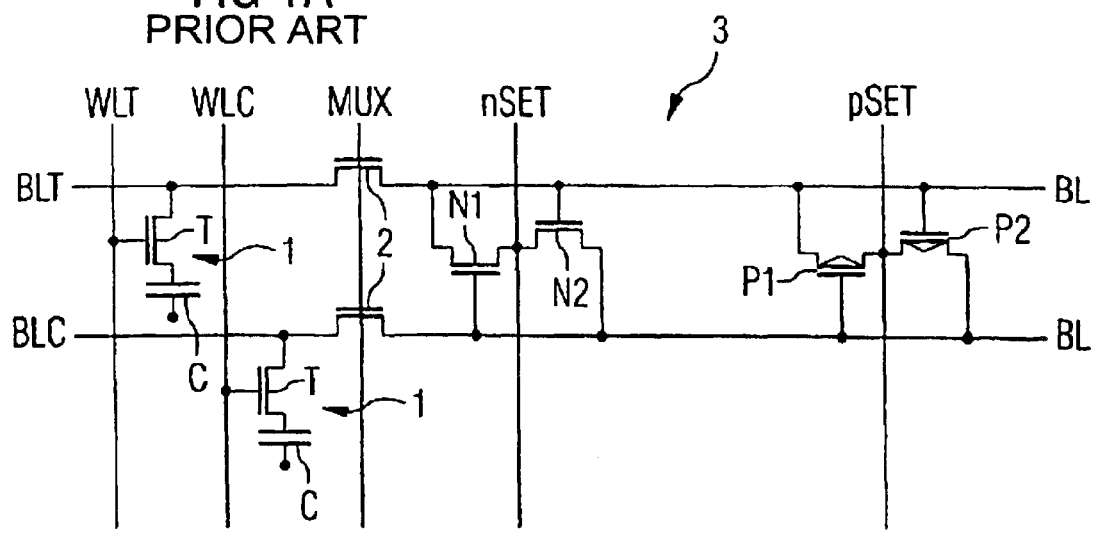
FIG. 1A is a circuit diagram showing a read-out circuit according to the prior art.

Referring now to the figures of the drawings in detail and first, particularly to FIG. 1 thereof, there is shown a detail from a dynamic memory in accordance with the prior art with a bit line pair $BLP_1$, $BLP_2$ (see FIG. 3A) with the first bit line BLT and the second bit line BLC. The bit lines BL are crossed by two word lines WLT, WLC, memory cells 1 being disposed alternately. In other words, a memory cell 1 is disposed at the crossover point between the first bit line BLT and the first word line WLT and a second memory cell is disposed at the crossover point between the second bit line BLC and the second word line WLC. No memory cells are disposed at the crossover points between the first bit line BLT and the second word line WLT and at the crossover point between the second bit line BLC and the first word line WLC.

The memory cell 1 has a transistor T and a storage capacitor C. A control input of the transistor T is connected to the respective word line WLT, WLC. A first terminal of the transistor T is connected to the respective bit line BLT, BLC and a second terminal of the transistor T is connected to a first terminal of the storage capacitor C. A second terminal of the storage capacitor C is at a predetermined potential e.g. a ground potential or a mid-potential lying between a high and a low supply voltage potential.

Each of the bit lines BLT, BLC is connected to the sense amplifier 3 via a switch 2. The switches 2 are controlled by a switching signal MUX, which is preferably activated a short time after the activation of the word line WLT, WLC by the word line activation signal. The temporal offset between the activation of the word line WLT, WLC and the switching of the switching devices 2 is determined by the time in which the charges from the storage capacitor flow onto the corresponding bit line BLT, BLC with transistor T having been opened.

The sense amplifier 3 has a first N-channel transistor N1, a second N-channel transistor N2, a first P-channel transistor P1, and a second P-channel transistor P2.

The first N-channel transistor N1 is connected to the first bit line BLT by its first terminal, to the second bit line by its control terminal and to an nset signal nset by a second terminal. The second N-channel transistor N2 is connected to the second bit line BLC by a first terminal, to the first bit line BLT by a control terminal and to the nset signal nset by a second terminal.

The first P-channel transistor P1 is connected to the first bit line BLT by a first terminal, to the second bit line BLC by a control signal terminal and to a pset signal pset by a second terminal. The second P-channel transistor P2 is connected to the second bit line BLC by a first terminal, to the first bit line BLT by a control signal terminal and to the pset signal pset by a second terminal.

The amplifier circuit formed by the two N-channel transistors N1, N2 and the two P-channel transistors P1 and P2 is able to isolate small charge differences on the adjacent bit lines.

It is assumed below that the potential of the first bit line BLT is higher than the potential of the second bit line BLC. The higher potential of the first bit line BLT brings about, via the second N-channel transistor N2, a decrease in the potential of the second bit line BLC to a ground potential which is made available by the nset signal after the switching from a mid-potential VBLEQ to the ground potential GND. As a result, the first N-channel transistor N1 is no longer activated, so that the potential of the first bit line BLT initially remains uninfluenced. The mid-potential VBLEQ preferably lies midway between a high supply voltage potential VBLH and a ground potential GND. The lower potential of the second bit line BLC brings about, via the first P-channel transistor P1, an increase in the potential of the first bit line BLT to the high supply voltage potential VBLH as soon as the pset signal pset is switched from a mid-potential VBLEQ to the high supply voltage potential VBLH. The nset signal nset and the pset signal pset are usually switched with a short time delay. However, the nset signal nset and the pset signal pset can also be switched simultaneously.

Figure 1B:
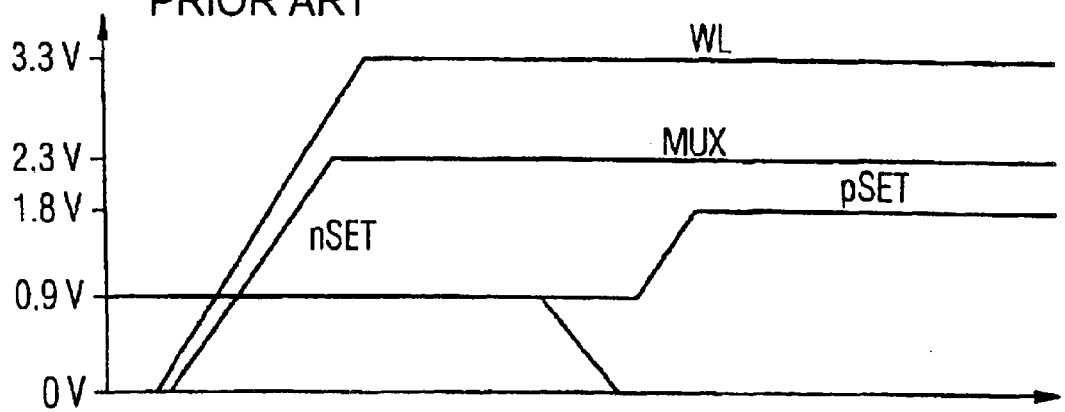
FIG. 1B is a graph showing a timing diagram for the read-out circuit according to the prior art.

FIG. 1B illustrates a timing diagram for the driving of the word lines of the switching device 2 and of the sense amplifier 3. Firstly, one of the word lines WLT, WLC is activated by the word line activation signal. As soon as the charge from the storage capacitor has flowed onto the corresponding bit line BLT, BLC, the switching device of the bit lines is opened by using the switching signal MUX and the potentials of the bit lines are passed to the sense amplifier 3.

The N-channel transistors N1, N2 of the sense amplifier 3 are applied to the nset signal nset, which, upon activation, specifies the low level to which the bit line with the lower potential is to be pulled. In the non-activated state, the nset signal nset is at a mid-potential VBLEQ, for instance 0.9 V.

The P-channel transistors P1, P2 are connected to a pset signal pset, which, in the event of read-out, specifies the high potential to which the bit line with the higher potential is to be pulled. The high potential of the pset signal pset is preferably about 1.8 V, while the low potential of the nset signal nset is about 0 V.

FIG. 2 schematically illustrates a memory cell array 10 with memory cells 1. It has word lines WLT, WLC and bit lines BLT, BLC. The bit lines are organized into bit line pairs BLP, and the bit line pairs BLP can be read via sense amplifiers 3. For layout reasons, a memory cell array is constructed in a plurality of parts so that the sense amplifiers 3 are offset with respect to one another, i.e. successively on different sides of the bit line BLT, BLC. As a result, the sense amplifiers 3 can be divided between two adjacent parts of the memory cell array and the silicon area is optimally utilized.

Figure 3A:
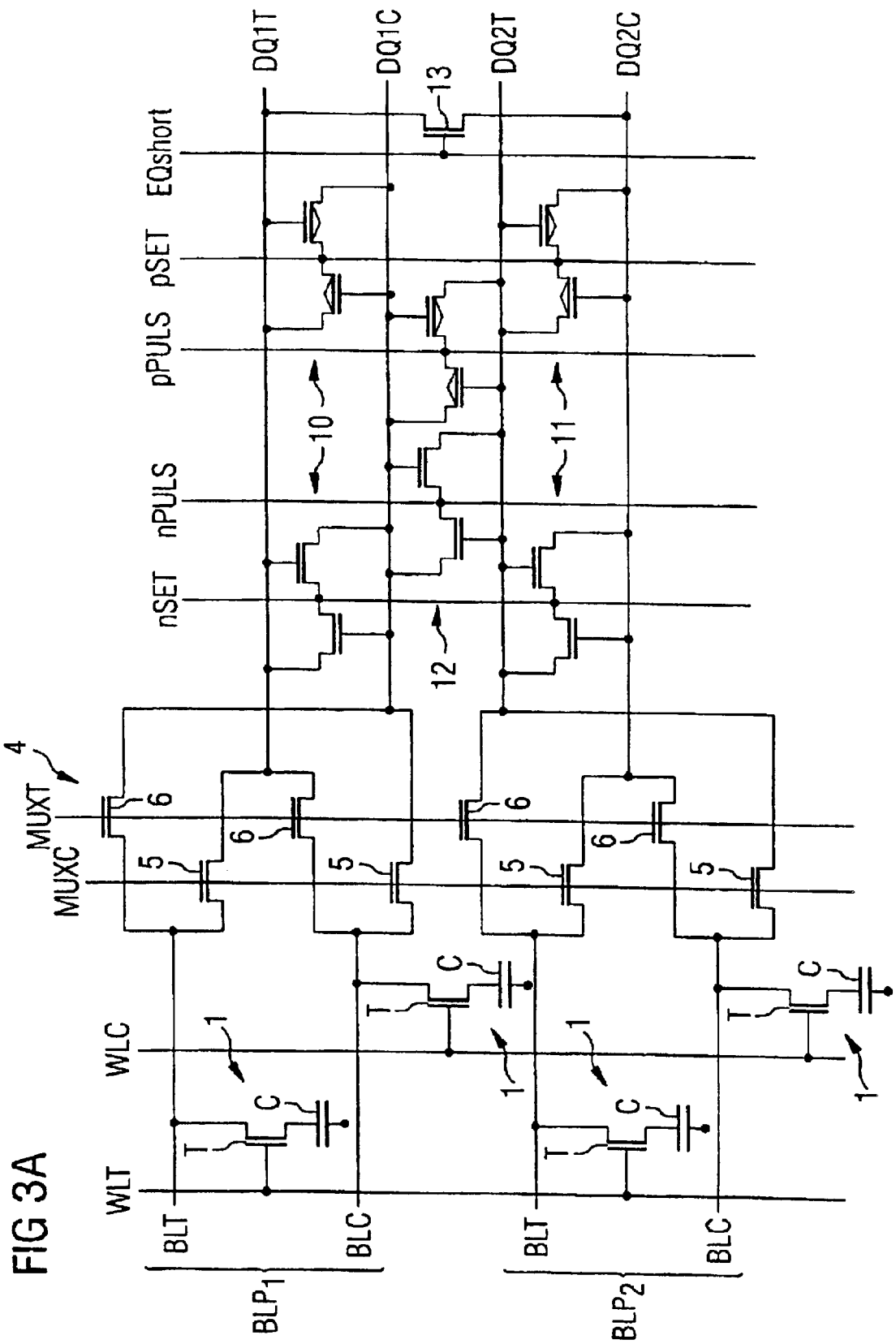
FIG. 3A is a circuit diagram showing a read-out circuit according to the invention.

FIG. 3A illustrates a preferred embodiment of the read-out circuit according to the invention. The illustration shows bit line pairs BLP1, BLP2 with the memory cells connected thereto. In the same way as illustrated in the prior art with regard to FIG. 1A, the memory cells 1 are disposed alternately at the word lines WLT, WLC and bit lines BLT, BLC. The functioning of the memory cells 1 and the read-out of the memory cells onto the bit lines BLT, BLC do not differ from the manner described above with regard to the prior art. Whereas the switching device 2 in the prior art merely connects the read-out charge on the bit lines BLT, BLC to the sense amplifier 3, the switching device in accordance with the embodiment of the invention as illustrated in FIG. 3A furthermore has an interchanging circuit 4.

The interchanging circuit 4 provides, for each of the bit lines BLT, BLC of a bit line pair BLP1, BLP2 that each of the bit lines BLT, BLC can be applied either to a first or to a second line. To that end, a first switching transistor 5 and a second switching transistor 6 are provided for each of the bit lines BLT, BLC. The first switching transistors 5 are driven by a second switching signal MUXC via their control inputs, and the second switching transistors 6 are driven by a first switching signal MUXT.

If the first switching transistors 5 are opened by the second switching signal MUXC, then the first bit line BLT of the first bit line pair BLT1 is connected to a first data output line DQ1T. The second bit line BLC of the first bit line pair BLP1 is then connected to a second data output line DQ1C, the first bit line BLT of the second bit line pair BLP2 is connected to a third data output line DQ2T and a second bit line BLC of the second bit line pair BLP2 is connected to a fourth data output line DQ2C. The second switching transistors 6 are then closed by a first switching signal MUXT present at the control inputs of the second switching transistors 6.

If the second switching transistors 6 are opened by the first switching signal MUXT, the first switching transistors 5 are closed under the control of the second switching signal MUXC. If the second switching transistors 6 are switched into the on state, then the first bit line BLT of the first bit line pair BLP1 is connected to the second data output line DQ1C, the second bit line BLC of the first bit line pair BLP1 is connected to the first data output line DQ1T, the first bit line BLT of the second bit line pair BLP2 is connected to the third data output line DQ2T and the second bit line BLC of the second bit line pair BLP2 is connected to the fourth data output line DQ2C.

The first switching signal MUXT is activated at the same time as the activation of the first word line WLT with the corresponding word line activation signal in order to connect the bit lines BLT of the two bit line pairs BLP1, BLP2, onto which the charges of the storage capacitors have flowed, to the second data output line DQ1C and to the third data output line DQ2T, respectively. To that end, the second switching transistors 6 are activated with the aid of the first switching signal MUXT if the memory cells on the first bit lines BLT of the two bit line pairs BLP1, BLP2 are activated by the corresponding word line activation signal for the first word line WLT. The first bit lines BLT of the bit line pairs BLP1, BLP2 are then applied to the second data output line DQ1C and third data output line DQ2T. Equally, it is also provided that the second switching signal MUXC is applied at the same time as the activation of the second word line WLC.

Disposed between the first data output line DQ1T and the second data output line DQ1C is a first sense amplifier 10, which is constructed in the manner described above in connection with FIG. 1 and whose function is identical. The first sense amplifier 10 isolates the potential difference on the data output lines DQ1T and DQ1C, so that the items of information read out from the memory cells 1 can be read out via the data output lines DQ1T, DQ1C.

A second sense amplifier 11, which is constructed and functions in the same manner, is likewise provided between the third data output line DQ2T and the fourth data output line DQ2C.

The read-out circuit according to the invention now provides for a third sense amplifier 12 to be provided between the second data output line DQ1C and the third data output line DQ2T. The third sense amplifier 12 is able to amplify the potential difference between the second data output line DQ1C and the third data output line DQ2T.

If different items of information are stored in the read memory cells 1 of the two bit line pairs BLP1, BLP2, then there is a potential difference between the second data output line DQ1C and the third data output line DQ2T that corresponds to the charge difference between the charge of a bit line that is increased by the charge of a storage capacitor, and the charge of a bit line that is decreased by the charge of a storage capacitor. Potential differences that result from the charge of a storage capacitor and the charge of a bit line without an applied storage capacitor are present between the first data output line DQ1T and the second data output line DQ1C, and also between the third data output line DQ2T and the fourth data output line DQ2C.

Consequently, the third sense amplifier 12 between the second data output line DQ1C and the third data output line DQ2T sees a potential difference which is higher than the potential difference which the first and second sense amplifiers 10, 11 have present at their inputs. The third sense amplifier 12 thus supports the amplification of the potential difference of the different charges on the second and third data output lines DQ1C, DQ2T by the first and second sense amplifiers 10, 11 in that the potentials of the data output lines DQ1C and DQ2T are pulled apart by the third sense amplifier 12 likewise in a direction corresponding to the directions of the relevant bit lines of the first and second sense amplifiers 10, 11.

The third sense amplifier 12 receives either the same nset signal nset and pset signal pset as the rest of the sense amplifiers or an npuls signal npuls and a ppuls signal ppuls, respectively, which is pulsed with respect to the nset signal nset and pset signal pset. The pulsed nset signal and pset signal are withdrawn again, that is to say taken back to the mid-potential VBLEQ, after a predetermined time, i.e. before the nset signal nset and pset signal pset.

If the memory cells to be read contain the same information, then the charges of the bit line BLT, BLC are either equally increased or decreased in each case by the charge of a memory cell. Consequently, the same charge of a bit line BLT, BLC that has been increased or decreased by the charge of a storage capacitor is ideally present at the second data output line DQ1C and at the third data output line DQ2T. The third sense amplifier 12 is thus ideally not able to identify and amplify a potential difference. The amplification of the potential difference for reading out the data is thus performed exclusively by the first and second sense amplifiers 10, 11 applied to the respective bit line pairs.

In practice, however, it happens that the storage capacitors are discharged at different speeds by leakage currents due to leakage mechanisms or that the storage capacitors C of memory cells 1 to be read are of different magnitude due to fluctuations in the production process. If identical items of information are stored in the memory cells 1 to be read, but the charges stored in the storage capacitors are somewhat different, then different potentials are present on the second data output line DQ1C and the third data output line DQ2T. Both potentials that are intended to represent a high level, for example, are in each case pulled to a high bit line potential by the sense amplifiers 10, 11 at the bit line pairs.

In order that the third sense amplifier 12 cannot perform erroneous potential isolation due to the charge difference on the second data output line DQ1C and the third data output line DQ2T and dominates the first and the second sense amplifier 10, 11, provision is made of a charge equalization device 13 disposed between the first data output line DQ1T and the fourth data output line DQ2C. The charge equalization device 13 includes an N-channel transistor driven by an equalization signal EQ-short. The charge equalization device 13 operates in such a way that the potential of the first data output line DQ1T and the potential of the fourth data output line DQ2C are held at the same potential during read-out. This supports the charge isolation of the first and second read-out circuits 10, 11, particularly when data of the same type are read out.

By way of example, if a charge which is greater than the equalized charge of a bit line BL is respectively stored in the memory cells, then this corresponds to the information "1". The bit lines BL on which these elevated charges are situated are applied via the switching device 4 to the second data output line DQ1C and the third data output line DQ2T. The first sense amplifier 10 amplifies the potential difference between the first data output line DQ1T and the second data output line DQ1C, and the second sense amplifier 11 amplifies the potential difference between the third data output line DQ2T and the fourth data output line DQ2C, so that a high bit line potential is present on the second DQ1C and third data output lines DQ2T and a low bit line potential is in each case present on the first and fourth data output lines DQ1T, DQ2C.

If the charges on the bit lines are unidirectional but have unequal magnitude due to "strong" and "weak" memory cells, then the charge equalization device 13 counteracts the isolation of the charges by the sense amplifier 12. By way of example, if the charge of a strong memory cell is applied on the second data output line DQ1C and the charge of a weak memory cell is applied on the data output line DQ2T, then the first sense amplifier 10 very rapidly isolates the potentials of the first and second data output lines DQ1T, DQ1C and reduces (given a larger charge of the second data output line DQ1T) the charge of the first data output line DQ1T. The decreasing potential present on the first data output line DQ1T is forwarded via the charge equalization device 13 to the fourth data output line DQ2C, so that the potential difference between the third data output line DQ2T and the fourth data output line DQ2C is likewise increased. As a result, the charge isolation of the second sense amplifier 11 is accelerated and coupled to the charge isolation of the first sense amplifier 10. Consequently, the charge equalization device 13 can support the charge isolation of two adjacent bit line pairs BLP1, BLP2 if identical charges were stored in the relevant memory cells.

In this case, the third sense amplifier 12 operates counter to the first and second sense amplifiers 10, 11 in the event of small charge differences between the second DQ1C and third data output lines DQ2T. It is thus expedient to increase the driver strength of the sense amplifiers 10, 11 with respect to the driver strength of the third sense amplifier 12 in order that the third sense amplifier 12 does not perform charge isolation or amplification of the potential difference if the high bit line potential in each case is to be present on the adjacent second and third data output lines DQ1C, DQ2T. Consequently, the first and second sense amplifiers 10, 11 operate counter to the third sense amplifier 12 if the memory cells 1 addressed by a word line WLT, WLC contain the same information.

Figure 3B:
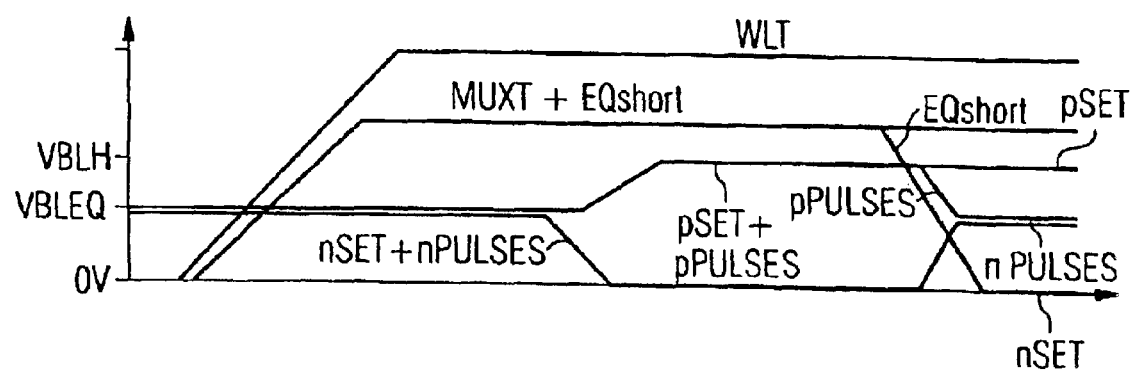
FIG. 3B is a graph showing a timing diagram for the read-out circuit shown in FIG. 3A.

FIG. 3B illustrates a timing diagram illustrating the profile of the signals which are used to control the first and second and third read-out circuits 10, 11, 12. The application of the word line activation signal to the first word line WLT is followed shortly afterward by the application of the first switching signal MUXT for opening the second switching transistors 6. The charge of the first bit lines BLT of the bit line pairs BLP1, BLP2 then flows onto the second and third data output lines DQ1C and DQ2T. As described with reference to FIG. 1, the nset signal nset and the pset signal pset are initially at a mid-potential VBLEQ. The npuls signal npuls and the ppuls signal ppuls for the third sense amplifier 12 are initially likewise at the mid-potential VBLEQ and then on activation prescribe a high bit line potential VBLH and a low bit line potential VGND.

The charge equalization signal EG-short is activated at the same time as the first and respectively the second switching signal MUXT, MUXC in order to hold the charges, i.e. the potential, on the first and fourth data output lines DQ1T and DQ2C during amplification, while the sense amplifiers 10, 11 increase the potential difference between the adjacent first and second and respectively third and fourth data output lines DQ1T, DQ1C, DQ2T, DQ2C.

The charge equalization device 13 has the advantage that the amplification of a weak signal can be supported if identical items of information are present on adjacent bit lines, i.e. unidirectional charges are present on the second and third data output lines DQ1C, DQ2T. As a result of the short circuit of the first and fourth data output lines DQ1T and DQ2C during read-out, the potential difference between a strong signal from a strong memory cell with respect to the mid-voltage is assessed more rapidly than the weak signal from the weak memory cell. The sense amplifier at which the strong signal is present thus isolates the charge more rapidly, so that a change in charge from the respectively complementary data output line is effected in the opposite direction with regard to the data output line with the strong signal. Since the complementary data output line is short-circuited with the respectively complementary data output line of the bit line with the weak signal, the sense amplifier which is intended to amplify the weak signal is helped to carry out the isolation of the charges. The assessment by the third sense amplifier 12 between the potential difference between a strong signal and a weak signal is thereby suppressed. The coupling of the respectively complementary data output lines contains a second assessment of a weak signal with respect to the mid-voltage VBLEQ.

If different items of information are stored on adjacent bit lines, then differently directed charges are present on the second and third output lines DQ1C, DQ2T. In this case, the third sense amplifier 12 supports the charge isolation of the first and second sense amplifiers 10, 11. Because, in the event of different items of information on adjacent bit lines, the charge equalization device 13 and, in the event of identical items of information on adjacent bit lines, the third sense amplifier 12 in each case operate counter to the first and second sense amplifiers 10, 11, the charge equalization device 13 is turned off by the equalization signal EQ-short and the third sense amplifier 12 is turned off by the npuls signal npuls and the ppuls signal ppuls before the complete isolation of the charges has been performed by the first sense amplifier 10 and the second sense amplifier 11.

Figure 4:
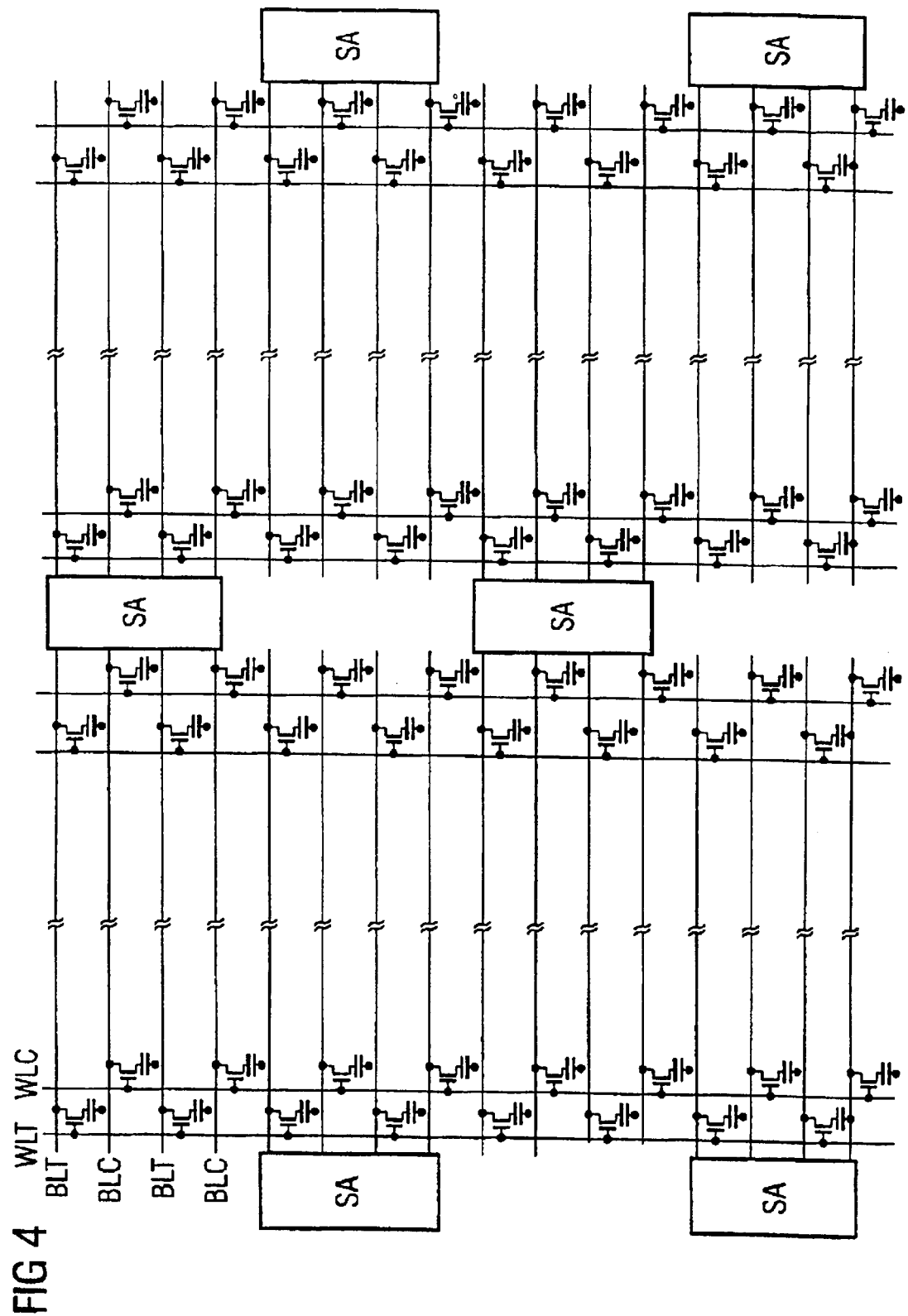
FIG. 4 is a schematic illustration showing a configuration of the read-out circuit in a cell array.

In contrast to the previous read-out circuits, read-out circuits according to the invention are provided, then, which are in each case connected to four bit lines instead of to two bit lines. The read-out circuits are respectively disposed alternately on the left-hand and right-hand sides of a memory cell array, this producing the pattern of the read-out circuits according to the invention as illustrated in FIG. 4.

I claim:

1. In a memory cell array having word lines, bit lines organized in pairs, and memory cells addressable via the word lines and the bit lines, each of the memory cells having a respective storage capacitor, and each of the storage capacitors being connectable to one of the bit lines of one of the bit line pairs by activation by one of the word lines; a read-out circuit, comprising:

an interchanging circuit connected to each of the bit lines of one of the bit line pairs and having a first data output line, a second data output line adjacent said first data output line, a third data output line adjacent said second output line, and a fourth data output line adjacent said third output line;

said interchanging circuit being configured to apply the bit lines connected to the storage capacitors to said second and third data output lines by activating the word line and to apply the bit lines not connected to the memory cells to said first and fourth data output lines;

a first sense amplifier connected to said first and second data output lines;

a second sense amplifier connected to said third and fourth data output lines; and a third sense amplifier connected to said second and third data output lines;

said first, second, and third sense amplifiers each being configured to amplify a potential difference on said respective two connected lines.

2. The read-out circuit according to claim 1, wherein:

a first and a second word line are provided;

the first bit line of the respective bit line pair is configured to be connected to the corresponding storage capacitors by activating the first word line and the second bit line of the respective bit line pair being configured to connect to the corresponding storage capacitors by activating the second word line;

said interchanging circuit being configured to apply, when activating the first word line, the first bit lines of the two bit line pairs to said second and said third data output line and sad second bit lines to said first and said fourth data output line, and to apply, when activating the second word line, the second bit lines of the two bit line pairs to said second and said third data output line and the first bit lines to said first and said fourth data output line.

3. The read-out circuit according to claim 1, further comprising a first and second bit line potential;

said sense amplifiers each having respective a first transistor, a second transistor, a third transistor, and a fourth transistor;

a first terminal of said first transistor being connected to the first bit line and a second terminal of said first transistor being connected to said first bit line potential;

a first terminal of said second transistor being connected to the second bit line and a second terminal of said second transistor being connected to said first bit line potential;

a first terminal of said third transistor being connected to the first bit line and a second terminal of said third transistor being connected to said second bit line potential; and a first terminal of said fourth transistor being connected to the second bit line and a second terminal of said fourth transistor being connected to said second bit line potential.

4. The read-out circuit according to claim 1, wherein:

said first, second, and third sense amplifiers have respective driver strengths; and the driver strength of said third sense amplifier is less than at least one of the driver strength of said first and said second sense amplifiers.

5. The read-out circuit according to claim 1, further comprising a potential equalization circuit disposed between said first data output line and said fourth data output line and configured to equalize potentials between said first data output line and said fourth data output line depending on an equalization control signal.

6. A memory cell array, comprising:

word lines;

bit lines organized in pairs;

memory cells addressable via said word lines and said bit lines, each of said memory cells having a respective storage capacitor, and each of said storage capacitors being connectable to one of said bit lines of one of said bit line pairs by activation by one of said word lines; and a read-out circuit including:

an interchanging circuit connected to each of said bit lines of one of said bit line pairs and having a first data output line, a second data output line adjacent said first data output line, a third data output line adjacent said second output line, and a fourth data output line (DQ2C) adjacent said third output line;

said interchanging circuit being configured to apply said bit lines connected to said storage capacitors to said second and third data output lines by activating said word line and to apply said bit lines not connected to the memory cells to said first and fourth data output lines;

a first sense amplifier connected to said first and second data output lines;

a second sense amplifier connected to said third and fourth data output lines; and a third sense amplifier connected to said second and third data output lines;

said first, second, and third sense amplifiers each being configured to amplify a potential difference on said respective two connected lines.

7. A method for amplifying and reading data stored in a memory cell array, which comprises:

providing a read-out circuit according to claim 1;

activating one of the word lines; and driving the interchanging circuit to apply the bit lines connected to the storage capacitors to the second and third data output lines.

8. The method according to claim 7, which further comprises applying an nset signal and a pset signal to the first and second sense amplifiers simultaneously with the activating of the word line, the nset signal and the pset signal determining a high and a low potential for the data output lines.

9. The method according to claim 8, which further comprises applying an npuls signal and a ppuls signal, to the third sense amplifier simultaneously with the activating of the word line, the npuls signal and the ppuls signal being pulsed with respect to the nset signal and a pset signal, the npuls signal and the ppuls signal determining a high and a low potential for the data output lines.

* * * * *